(12) United States Patent
Tang et al.

(10) Patent No.: US 10,461,734 B2
(45) Date of Patent: Oct. 29, 2019

(54) ACTIVE LOAD GENERATION CIRCUIT AND FILTER USING SAME

(71) Applicant: REALTEK SEMICONDUCTOR CORPORATION, Hsinchu (TW)

(72) Inventors: Wei-Cheng Tang, Hsinchu County (TW); Kuohsi Wu, Taipei (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 16/159,250

(22) Filed: Oct. 12, 2018

(65) Prior Publication Data

US 2019/0149146 A1 May 16, 2019

(30) Foreign Application Priority Data

Nov. 14, 2017 (TW) .............................. 106139253 A

(51) Int. Cl.
*H01L 35/00* (2006.01)
*H01L 37/00* (2006.01)
(Continued)

(52) U.S. Cl.
CPC ........... *H03K 17/145* (2013.01); *H01L 23/64* (2013.01); *H03K 17/223* (2013.01); *H03L 1/04* (2013.01); *H03K 2017/0806* (2013.01)

(58) Field of Classification Search
CPC ............... H03K 17/145; H03K 17/223; H03K 2017/0806; H01L 23/64; H03L 1/04
See application file for complete search history.

(56) References Cited

U.S. PATENT DOCUMENTS 4,509,019 A * 4/1985 Banu .................. H03H 11/1291
330/107
6,107,868 A * 8/2000 Diniz ...................... G05F 3/245
327/512
(Continued)

FOREIGN PATENT DOCUMENTS

CN 103684279 A 3/2014

OTHER PUBLICATIONS

Taiwan intellectual property office, Office action dated Sep. 20, 2018. English summary on p. 1.

*Primary Examiner* — Kenneth B Wells
(74) *Attorney, Agent, or Firm* — WPAT, PC

(57) ABSTRACT

This invention discloses an active load generation circuit and a filter. The active load generation circuit includes a transistor, a voltage control circuit, a voltage offset and tracking circuit, and a temperature sensing circuit. The transistor provides an impedance and includes a control terminal and an input terminal. The control terminal receives a control voltage, the input terminal receives an input signal, and the impedance is associated with the control voltage. The voltage control circuit generates an intermediate voltage according to a power supply voltage and a first reference voltage. The voltage offset and tracking circuit generates the control voltage according to the input signal and the intermediate voltage such that the control voltage varies with the input signal. The temperature sensing circuit senses an ambient temperature of the active load generation circuit and adjusts the first reference voltage according to the ambient temperature.

17 Claims, 11 Drawing Sheets

(51) Int. Cl.
*H03H 11/04* (2006.01)
*H03H 11/12* (2006.01)
*H03K 17/14* (2006.01)
*H03K 17/22* (2006.01)
*H01L 23/64* (2006.01)
*H03L 1/04* (2006.01)
*H03K 17/08* (2006.01)

(56) References Cited

U.S. PATENT DOCUMENTS

| | | | |
|---|---|---|---|
| 8,067,975 B2 | 11/2011 | Fort | |
| 8,531,237 B2 * | 9/2013 | Aisu | ........................ G05F 1/575 323/273 |
| 9,013,226 B2 | 4/2015 | Dusad et al. | |

* cited by examiner

ACTIVE LOAD GENERATION CIRCUIT AND FILTER USING SAME

BACKGROUND OF THE INVENTION

1. Field of the Invention

The present invention relates to on-chip impedance, and, more particularly, to an active load generation circuit and a filter employing the same.

2. Description of Related Art

Passive components (e.g., resistors and capacitors) are commonly used in modern integrated circuits (ICs) but often occupy a large area. In the applications of modern ICs, the circuit area is becoming more and more critical; thus reducing the area of passive components becomes an important issue. Taking the filter commonly seen in the circuits as an example, in the circuit of FIG. 1A, the resistor R is fabricated inside the chip (on-chip), whereas the capacitor C is disposed outside the chip (off-chip) and connected with the resistor R through the pin 110 of the chip. In the circuit of FIG. 1B, both the resistor R and the capacitor C are fabricated inside the chip. The input signal Sin, which is a voltage signal or a current signal, is filtered by the filter and then becomes the output signal Sout, which is a voltage signal or a current signal. The cutoff frequency of the filter is $fc=1/(2\pi RC)$. In some applications, in order to achieve a low cutoff frequency fc, at least one of the resistor R and the capacitor C needs to be designed to have a large value. For the circuit design of FIG. 1A, the off-chip capacitor C can be designed to have a large capacitance value so that the resistor R can be made small and therefore occupies a relative small chip area; this circuit design, however, costs a pin 110 of the chip. For the circuit design of FIG. 1B, although no extra pin of the chip is taken, the resistor R must be made relatively large to achieve the same cutoff frequency fc because it is undesirable to manufacture a large on-chip capacitor.

As mentioned above, it is important to reduce the circuit area of passive components. Although active components can be used to replace passive components such as resistors to save area, the impedances of active components are more susceptible to process, voltage, and temperature, compared to passive resistors. Therefore, to produce impedance which is relatively unsusceptible to process, voltage, and temperature in a chip (i.e., IC) becomes an important issue.

SUMMARY OF THE INVENTION

In view of the issues of the prior art, an object of the present invention is to provide an active load generation circuit and a filter using the same. The active load generation circuit and the filter can save circuit area and prevent the circuit from being affected by the process, voltage, and temperature.

An active load generation circuit is provided. The active load generation circuit includes a transistor, a voltage control circuit, a voltage offset and tracking circuit, and a temperature sensing circuit. The transistor provides an impedance and has a control terminal and an input terminal. The control terminal receives a control voltage, the input terminal receives an input signal, and the impedance is related to the control voltage. The voltage control circuit is configured to generate an intermediate voltage according to a power supply voltage and a first reference voltage. The voltage offset and tracking circuit is coupled between the voltage control circuit and the transistor and configured to generate the control voltage according to the input signal and the intermediate voltage. The control voltage varies with the input signal. The temperature sensing circuit is coupled to the voltage control circuit and configured to sense an ambient temperature of the active load generation circuit and adjust the first reference voltage according to the ambient temperature.

An active load generation circuit is also provided. The active load generation circuit includes a transistor, a voltage control circuit, and a temperature sensing circuit. The transistor provides an impedance and has a control terminal. The control terminal receives a control voltage, and the impedance is related to the control voltage. The voltage control circuit is coupled to the transistor and configured to generate the control voltage according to a power supply voltage and a first reference voltage. The temperature sensing circuit is coupled to the voltage control circuit and configured to sense an ambient temperature of the active load generation circuit and adjust the first reference voltage according to the ambient temperature.

A filter is also provided. The filter includes a transistor, a capacitor, a voltage control circuit, and a temperature sensing circuit. The transistor provides an impedance and has a first terminal, a second terminal, and a control terminal. The first terminal receives an input signal, the second terminal outputs a filtered signal, the control terminal receives a control voltage, and the impedance is related to the control voltage. The capacitor is coupled to the second terminal. The voltage control circuit is configured to generate the control voltage according to a first reference voltage and coupled to a power supply voltage, a second reference voltage, and the transistor. The temperature sensing circuit is coupled to the voltage control circuit and configured to sense an ambient temperature of the filter and adjust the first reference voltage according to the ambient temperature.

The active load generation circuit of the present invention can provide a high impedance with a small area and is suitable for being implemented in ICs. Compared with the prior art, the impedance of the active load generation circuit of the present invention is less susceptible to the process, voltage, and temperature. In addition, the filter using the active load generation circuit of the present invention not only saves the pins, but also occupies a smaller circuit area for the same cutoff frequency.

These and other objectives of the present invention no doubt become obvious to those of ordinary skill in the art after reading the following detailed description of the preferred embodiments with reference to the various figures and drawings.

DETAILED DESCRIPTION OF THE EMBODIMENTS

The following description is written by referring to terms of this technical field. If any term is defined in this specification, such term should be explained accordingly. In addition, the connection between objects or events in the below-described embodiments can be direct or indirect provided that these embodiments are practicable under such connection. Said "indirect" means that an intermediate object or a physical space exists between the objects, or an intermediate event or a time interval exists between the events.

The disclosure herein includes an active load generation circuit and a filter using same. On account of that some or all elements of the active load generation circuit and the filter could be known, the detail of such elements is omitted provided that such detail has little to do with the features of this disclosure and this omission nowhere dissatisfies the specification and enablement requirements. A person having ordinary skill in the art can choose components equivalent to those described in this specification to carry out the present invention, which means that the scope of this invention is not limited to the embodiments in the specification. Note that since "resistance" is a special case of "impedance" (resistance is an impedance of zero phase), the term "impedance" in this specification may be referred to as an impedance of non-zero phase or an impedance of zero phase (i.e., resistance).

Figures 1A, 1B:
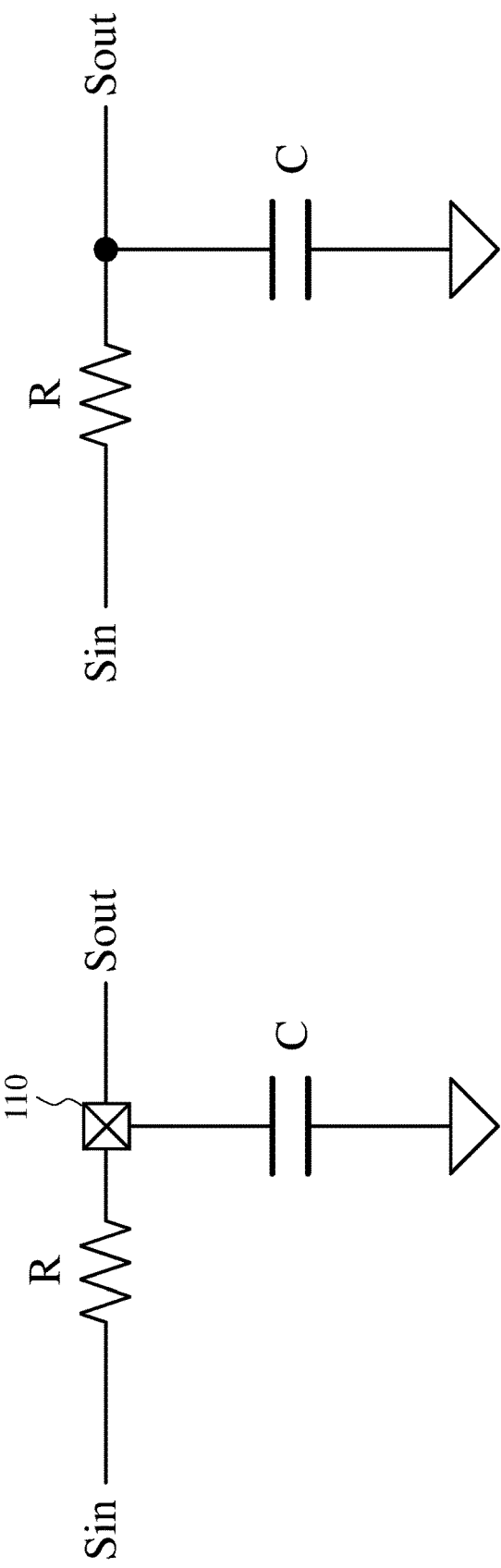
FIG. 1A illustrates a filter formed by an on-chip resistor and an off-chip capacitor.
FIG. 1B illustrates a filter formed by an on-chip resistor and an on-chip capacitor.
Figure 2:
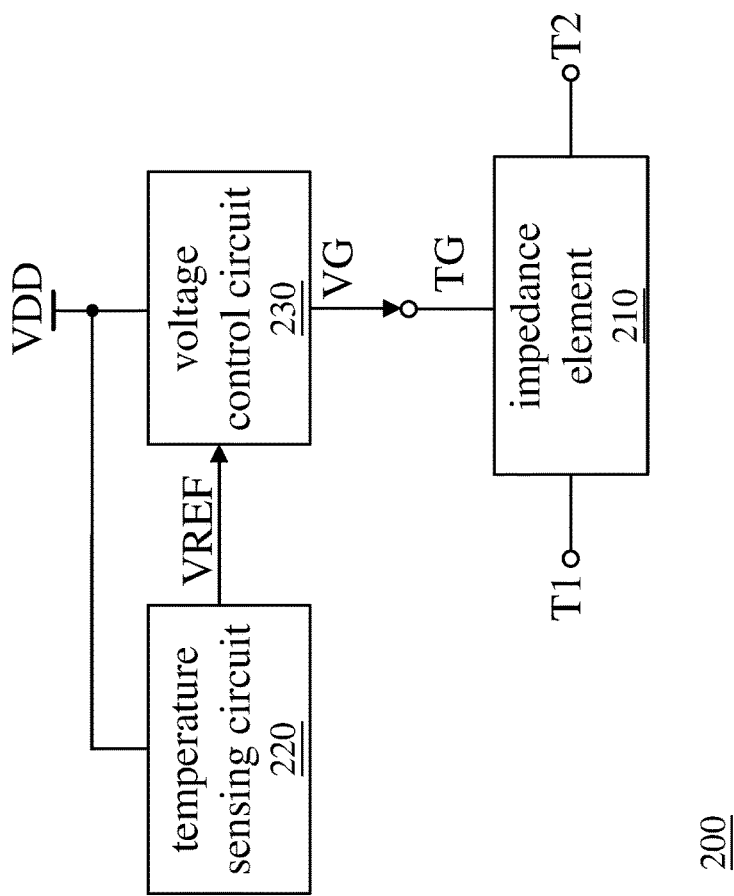
FIG. 2 illustrates a functional block diagram of an active load generation circuit according to an embodiment of the present invention.

FIG. 2 is a functional block diagram of an active load generation circuit according to an embodiment of the present invention. The active load generation circuit 200 is implemented in a chip and includes the impedance element 210, the temperature sensing circuit 220, and the voltage control circuit 230. The impedance element 210 provides an active load and has three terminals: T1, T2, and TG. The equivalent impedance of the impedance element 210 is between the terminals T1 and T2, and the control terminal TG receives the control voltage. The voltage control circuit 230 controls the impedance of the impedance element 210 by inputting the control voltage VG to the terminal TG. The voltage control circuit 230 generates the control voltage VG according to the first reference voltage VREF and the power supply voltage VDD of the active load generation circuit 200. The temperature sensing circuit 220 senses the ambient temperature of the active load generation circuit 200 and generates the first reference voltage VREF according to the ambient temperature.

Figure 3:
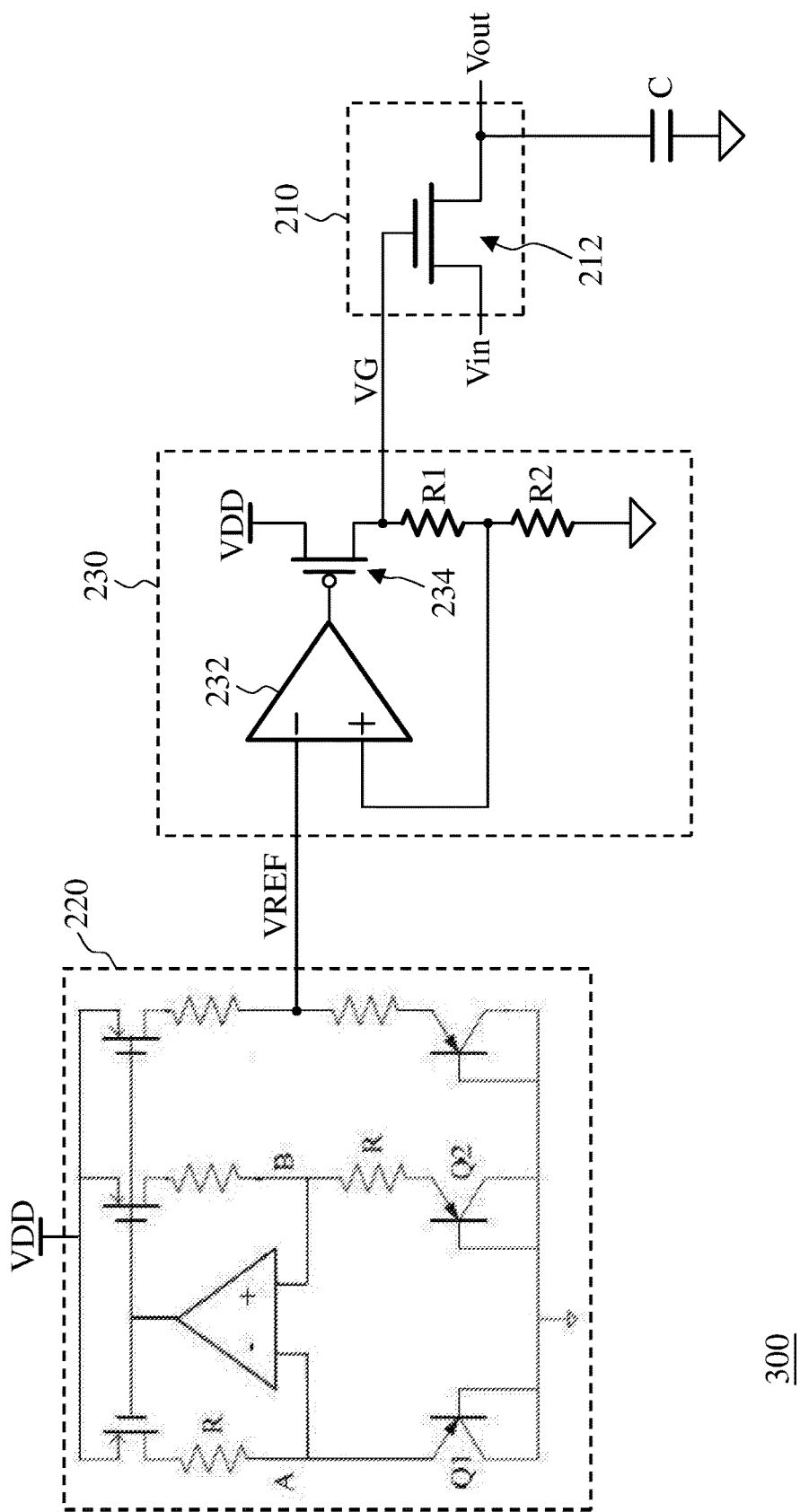
FIG. 3 illustrates a circuit diagram of a filter according to an embodiment of the present invention.

FIG. 3 is a circuit diagram of a filter according to an embodiment of the present invention. This filter is implemented by the active load generation circuit 200 of FIG. 2. The filter 300 is implemented in a chip and includes the impedance element 210, the temperature sensing circuit 220, the voltage control circuit 230, and the capacitor C. The impedance element 210 is implemented by an N-type metal-oxide-semiconductor field-effect transistor (hereinafter referred to as NMOS) 212. The source and drain of the NMOS 212 are the terminals T1 and T2 of the impedance element 210, and the gate of the NMOS 212 is the control terminal TG of the impedance element 210. The voltage control circuit 230 includes the operational amplifier 232, the P-type metal-oxide-semiconductor field-effect transistor (hereinafter referred to as PMOS) 234, and multiple series-connected resistors R1 and R2. Two resistors are shown in the figure for the purpose of explanation, not for limiting the scope of this invention. The PMOS 234 and the resistors R1 and R2 are connected in series between the power supply voltage VDD and a second reference voltage (e.g., ground), and the power supply voltage VDD is different from the second reference voltage. One of the input terminals (e.g., the inverting input terminal) of the operational amplifier 232 receives the first reference voltage VREF, and the other input terminal (e.g., the non-inverting input terminal) is coupled between the resistor R1 and the resistor R2. The output terminal of the operational amplifier 232 is coupled to the control terminal (i.e., the gate) of the PMOS 234. The output terminal of the PMOS 234 (i.e., the drain in the embodiment of FIG. 3) outputs the control voltage VG. The detailed circuit of the temperature sensing circuit 220 is shown in FIG. 3, and those of ordinary skilled in the art can understand the operating principles thereof, which are thus omitted for brevity.

The equivalent resistance Ron of the NMOS 212 is given by equation (1):

$$R_{on(NMOS)} = \frac{1}{\mu C_{ox}\left(\frac{W}{L}\right)(Vgs - |V_{th}|)} \quad (1)$$

The parameters μ, Cox and (W/L) in equation (1) are less susceptible to the process, voltage, and temperature and can therefore be regarded as constant values. The voltage Vgs is user controllable, and the threshold voltage Vth is susceptible to the process, voltage, and temperature. Thus, in order to make the equivalent resistance Ron of the NMOS 212 substantially insusceptible to the voltage and temperature, $(V_{gs}-|V_{th}|)$ are preferably substantially invariant with respective to the voltage and temperature. The voltage Vgs is the difference between the gate voltage of the NMOS 212 (i.e., the control voltage VG) and the source voltage of the NMOS 212 (i.e., the input voltage Vin).

From the circuit of FIG. 3, the voltage VG=VREF (1+R1/R2), meaning that the voltage VG is related to the first reference voltage VREF. The threshold voltage $|V_{th}|$ is a negative temperature coefficient, that is, the threshold voltage $|V_{th}|$ decreases as the temperature rises and increases as the temperature drops. In the case where the input voltage Vin is constant, in order to maintain $(V_{gs}-|V_{th}|)$ substantially constant, the control voltage VG should decrease when the temperature rises and should increase when the temperature drops. Therefore, the temperature sensing circuit 220 can be designed to output a lower first reference voltage VREF when the ambient temperature of the filter 300 increases and output a higher first reference voltage VREF when the ambient temperature of the filter 300 decreases.

Figure 4:
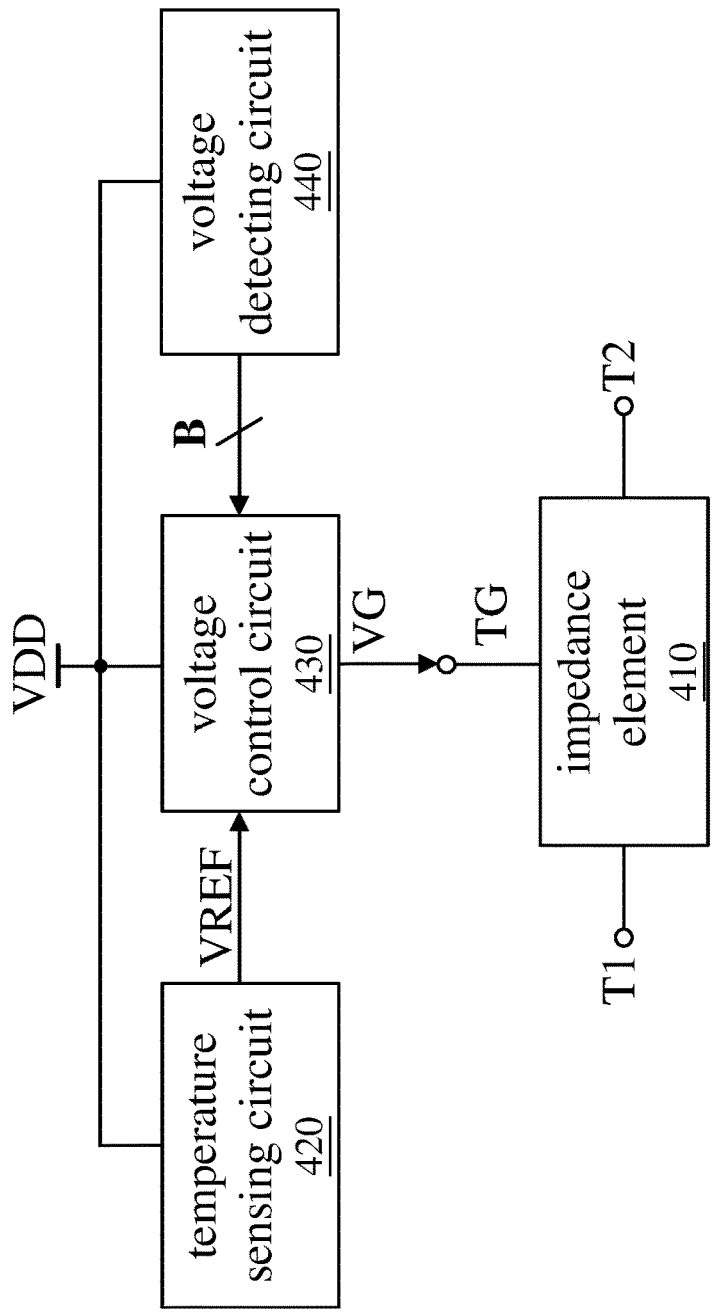
FIG. 4 illustrates a functional block diagram of an active load generation circuit according to another embodiment of the present invention.

FIG. 4 is a functional block diagram of an active load generation circuit according to another embodiment of the present invention. The active load generation circuit 400 is implemented in a chip and includes the impedance element 410, the temperature sensing circuit 420, the voltage control circuit 430, and the voltage detecting circuit 440. The impedance element 410 provides an active load and has three terminals: T1, T2, and TG. The equivalent impedance of the impedance element 410 is between the terminals T1 and T2, and the terminal TG receives the control voltage. The voltage control circuit 430 controls the impedance of the impedance element 410 by inputting a control voltage VG to the terminal TG. The voltage control circuit 430 generates the control voltage VG according to the power supply voltage VDD, the first reference voltage VREF, and the control value B. The temperature sensing circuit 420 senses the ambient temperature of the active load generation circuit 400 and generates the first reference voltage VREF according to the ambient temperature. The voltage detecting circuit 440 detects the power supply voltage VDD to generate the control value B.

Figure 5:
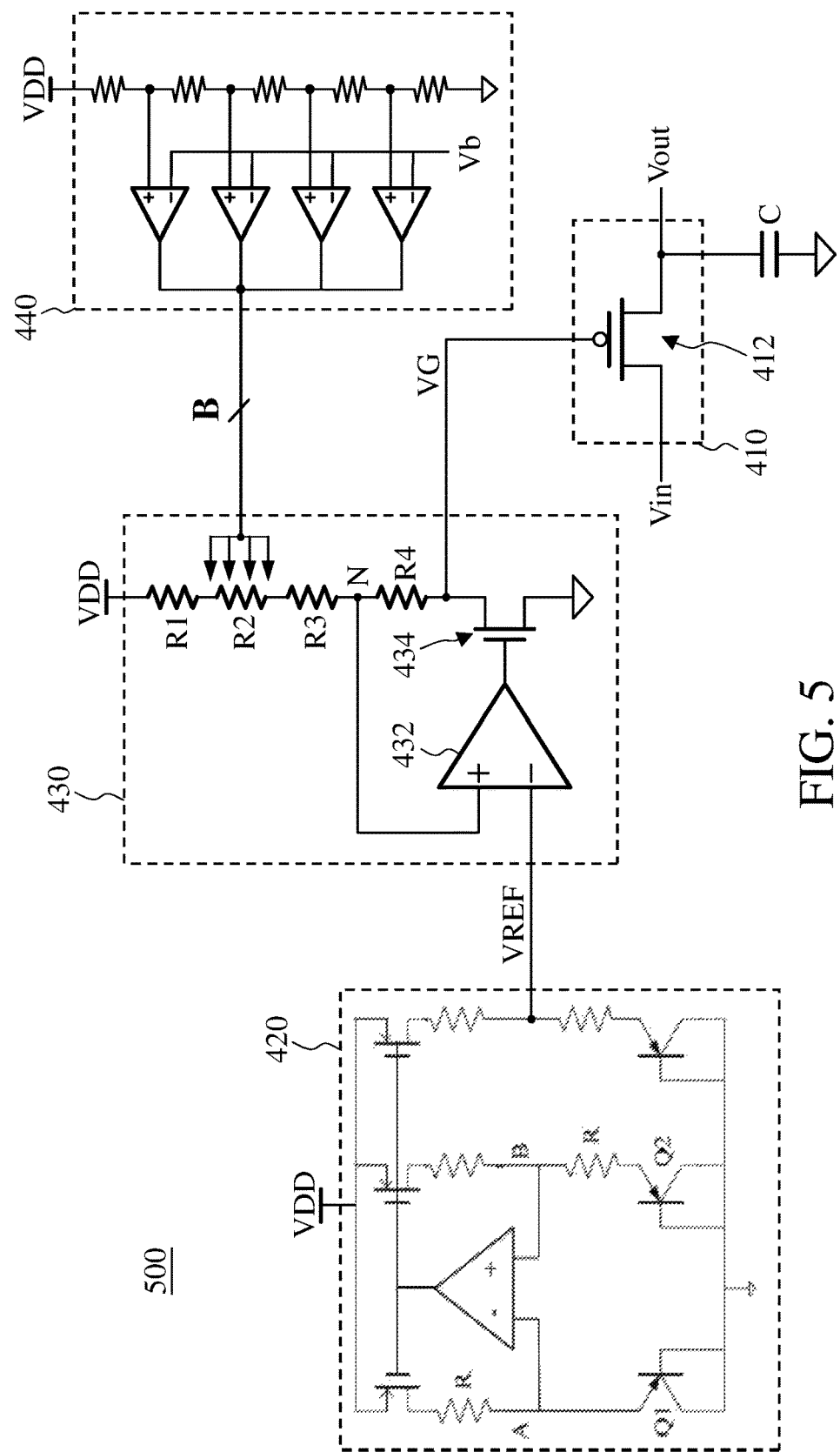
FIG. 5 illustrates a circuit diagram of a filter according to another embodiment of the present invention.

FIG. 5 is a circuit diagram of a filter according to another embodiment of the present invention. This filter is implemented by the active load generation circuit 400 of FIG. 4. The filter 500 is implemented in a chip and includes the impedance element 410, the temperature sensing circuit 420, the voltage control circuit 430, the voltage detecting circuit 440, and the capacitor C. The impedance element 410 is implemented by the PMOS 412. The source and drain of the PMOS 412 are the terminals T1 and T2 of the impedance element 410, and the gate of the PMOS 412 is the control terminal TG of the impedance element 410. The voltage control circuit 430 includes the operational amplifier 432, the NMOS 434, and multiple series-connected resistors R1 to R4. Four resistors are shown in the figure for the purpose of explanation, not for limiting the scope of this invention. The NMOS 434 and the resistors R1 to R4 are connected in series between the power supply voltage VDD and the second reference voltage (e.g., ground), and the power supply voltage VDD is different from the second reference voltage. One of the input terminals (e.g., the inverting input terminal) of the operational amplifier 432 receives the first reference voltage VREF, and the other input terminal (e.g., the non-inverting input terminal) is coupled between the resistor R3 and the resistor R4. The output terminal of the operational amplifier 432 is coupled to the control terminal (i.e., the gate) of the NMOS 434. The output terminal of the NMOS 434 (i.e., the drain in the embodiment of FIG. 5) outputs the control voltage VG. The detailed circuit of the temperature sensing circuit 420 is shown in FIG. 5, and those of ordinary skilled in the art can understand the operating principles thereof, which are thus omitted for brevity. In this embodiment, the temperature sensing circuit 420 and the temperature sensing circuit 220 have substantially identical circuit design that can generate a first reference voltage VREF with positive or negative temperature coefficient. The design and technology are well known to those of ordinary skill in the art and thus omitted for brevity.

The equivalent resistance Ron of the PMOS 412 can be expressed by equation (2):

$$R_{on(PMOS)} = \frac{1}{\mu C_{ox}\left(\frac{W}{L}\right)(V_{sg} - |V_{th}|)} \quad (2)$$

The voltage Vsg is the difference between the source voltage of the PMOS 412 (i.e., the input voltage Vin) and the gate voltage of the PMOS 412 (i.e., the control voltage VG). From the circuit of FIG. 5, the voltage VG is given by:

$$VG = VREF\left(1 + \frac{R4}{R1 + R2 + R3}\right) - \frac{R4}{R1 + R2 + R3}VDD \quad (3)$$

The voltage VG is related to the first reference voltage VREF and the power supply voltage VDD. In the case where the input voltage Vin is constant, in order to maintain $(V_{sg}-|V_{th}|)$ substantially constant, the control voltage VG should vary with the temperature and the power supply voltage VDD. Equation (3) is further discussed below in terms of the temperature and the power supply voltage VDD, respectively.

With regard to the temperature, the control voltage VG should increase when the temperature rises, and the control voltage VG should decrease when the temperature drops. Therefore, the temperature sensing circuit 420 can be designed to output a higher first reference voltage VREF when the ambient temperature of the filter 500 increases and output a lower first reference voltage VREF when the ambient temperature of the filter 500 decreases.

With regard to the power supply voltage VDD, in a preferred embodiment, the control voltage VG should, substantially, not change with the power supply voltage VDD. By referring to the control value B outputted by the voltage detecting circuit 440, the voltage control circuit 430 causes the control voltage VG to substantially not change with the power supply voltage VDD. In the embodiment of FIG. 5, the voltage detecting circuit 440 includes multiple resistors and multiple comparators. These resistors are connected in series between the power supply voltage VDD and the second reference voltage to provide multiple divided voltages. These comparators respectively compare the divided voltages with the predetermined voltage Vb to generate multiple comparison values. These comparison values can be collectively represented by the control value B; specifically, the control value B contains multiple bits, each corresponding to a comparison value. Therefore, the voltage detecting circuit 440 can be regarded as an analog-to-digital converter (ADC), and the control value B indicates the magnitude of the power supply voltage VDD. The voltage control circuit 430 adjusts the number of series-connected resistors according to the control value B. For example, the voltage control circuit 430 causes at least a part or all of the resistors to be bypassed or not bypassed by controlling, according to the control value B, multiple switches (not shown) connected in parallel with the resistors to switch on or off. More specifically, to make the voltage VG less affected by the change in the power supply voltage VDD, different approaches can be taken in cases where the power supply voltage VDD increases or decreases. When the power supply voltage VDD increases, the voltage control circuit 430 increases the equivalent resistance between the node N and the power supply voltage VDD according to the control value B (for example, controlling at least one switch to switch off so that the resistor(s) corresponding to the switch(es) is/are not bypassed). When the power supply voltage VDD decreases, the voltage control circuit 430 decreases the equivalent resistance between the node N and the power supply voltage VDD according to the control value B (for example, controlling at least one switch to switch on so that the resistor(s) corresponding to the switch(es) is/are bypassed).

The foregoing embodiments are applied to the cases where the input signal of the impedance element is substantially constant. The present invention also proposes solutions to the cases where the input signal of the impedance element is not substantially constant, as discussed in the following embodiments.

Figure 6:
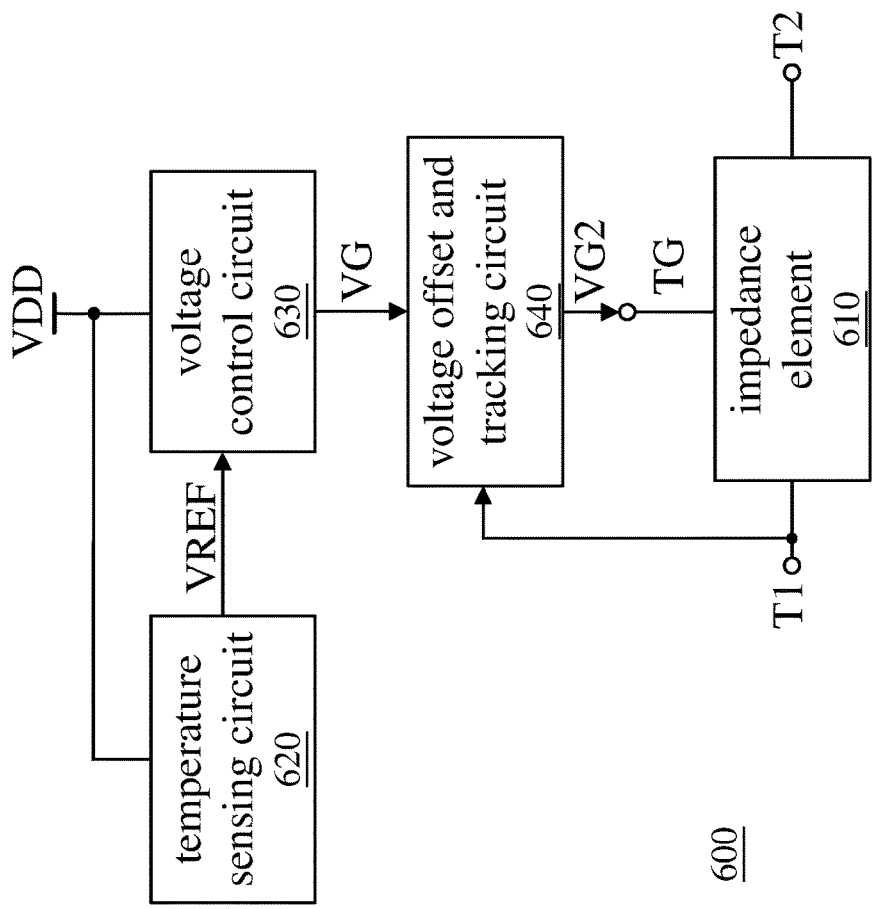
FIG. 6 illustrates a functional block diagram of an active load generation circuit according to another embodiment of the present invention.

FIG. 6 is a functional block diagram of an active load generation circuit according to another embodiment of the present invention. The active load generation circuit 600 includes the impedance element 610, the temperature sensing circuit 620, the voltage control circuit 630, and the voltage offset and tracking circuit 640. The functions and operations of the impedance element 610, the temperature sensing circuit 620, and the voltage control circuit 630 are similar or identical to those of the impedance element 210, the temperature sensing circuit 220, and the voltage control circuit 230 and thus omitted for brevity. The impedance element 610 receives an input signal at terminal T1, and the voltage control circuit 630 generates the intermediate voltage VG. The voltage offset and tracking circuit 640 generates the control voltage VG2 according to the input signal and the intermediate voltage VG, and the control voltage VG2 varies with the input signal. The control terminal TG of the impedance element 610 receives the control voltage VG2, and the impedance of the impedance element 610 is associated with the control voltage VG2.

Figure 7:
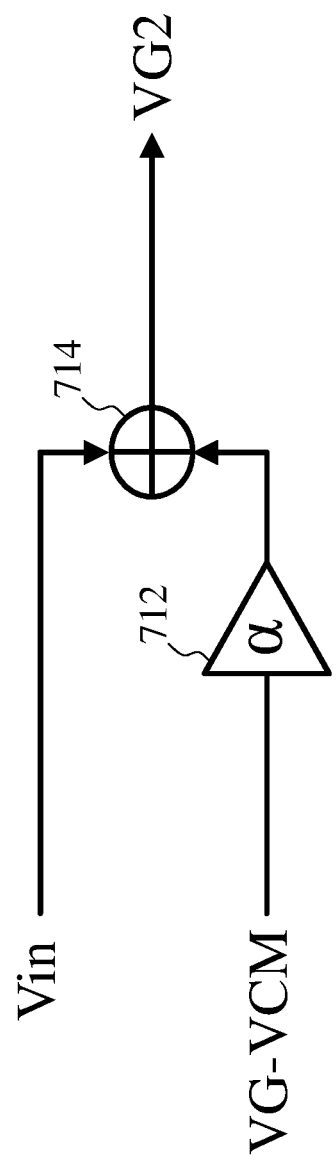
FIG. 7 illustrates a circuit diagram of a voltage offset and tracking circuit according to an embodiment of the present invention.

FIG. 7 is a circuit diagram of a voltage offset and tracking circuit according to an embodiment of the present invention. The voltage offset and tracking circuit 640 includes the amplifying circuit 712 (having a gain $\alpha$) and an adding circuit 714. The input signal of the amplifying circuit 712 is VG−VCM, where VCM is the common mode voltage of the input signal Vin. After amplification, the amplified voltage $\alpha$(VG−VCM) is outputted at the output terminal of the amplifying circuit 712. The adding circuit 714 adds the amplified voltage $\alpha$(VG−VCM) and the input signal Vin to thereby generate a control voltage VG2=$\alpha$(VG−VCM)+Vin. Observe that because the control voltage VG2 varies with the input signal Vin, the occurrence that the impedance element 610 cannot keep the load impedance fixed due to the change of the input signal Vin can be avoided. The gain $\alpha$ is a real number that can be adjusted according to the circuit designer's requirement for the impedance.

Figure 8:
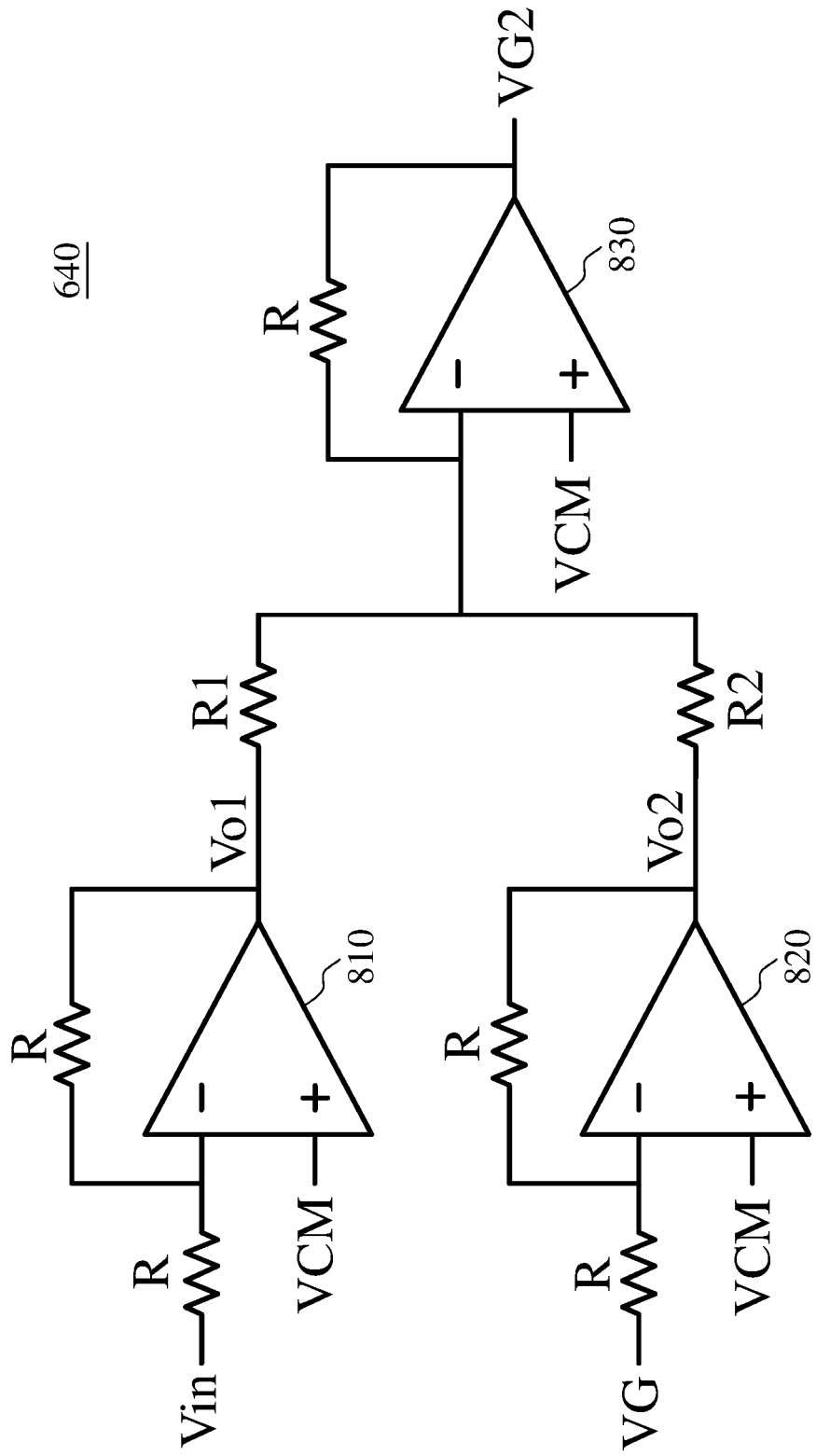
FIG. 8 illustrates a detailed circuit diagram of the circuit of FIG. 7 according to one embodiment.

FIG. 8 is a detailed circuit diagram of the circuit of FIG. 7 according to one embodiment. The voltage offset and tracking circuit 640 includes the operational amplifiers 810, 820, and 830. The positive terminal (non-inverting input terminal) of the operational amplifier 810 receives the common mode voltage VCM, and the negative terminal (inverting input terminal) of the operational amplifier 810 receives the input voltage Vin. The positive terminal of the operational amplifier 820 receives the common mode voltage VCM, and the negative terminal of the operational amplifier 820 receives the intermediate voltage VG. The positive terminal of the operational amplifier 830 receives the common mode voltage VCM, and the negative terminal of the operational amplifier 830 is coupled to the operational amplifiers 810 and 820 through the resistors R1 and R2, respectively. All resistors R have the same resistance value. When the ratio of the resistor R1=R to the resistor R2=R/$\alpha$ is $\alpha$, the output of the operational amplifier 810 Vo1=2VCM−Vin, the output of the operational amplifier 820 Vo2=2VCM−VG, and the control voltage VG2 outputted by the operational amplifier 830 is $$VG2 = VCM - \left[ \frac{(2VCM - Vin) - VCM}{R} + \frac{(2VCM - VG) - VCM}{\frac{R}{\alpha}} \right] * R =$$

$$\alpha(VG - VCM) + Vin.$$

Figure 9:
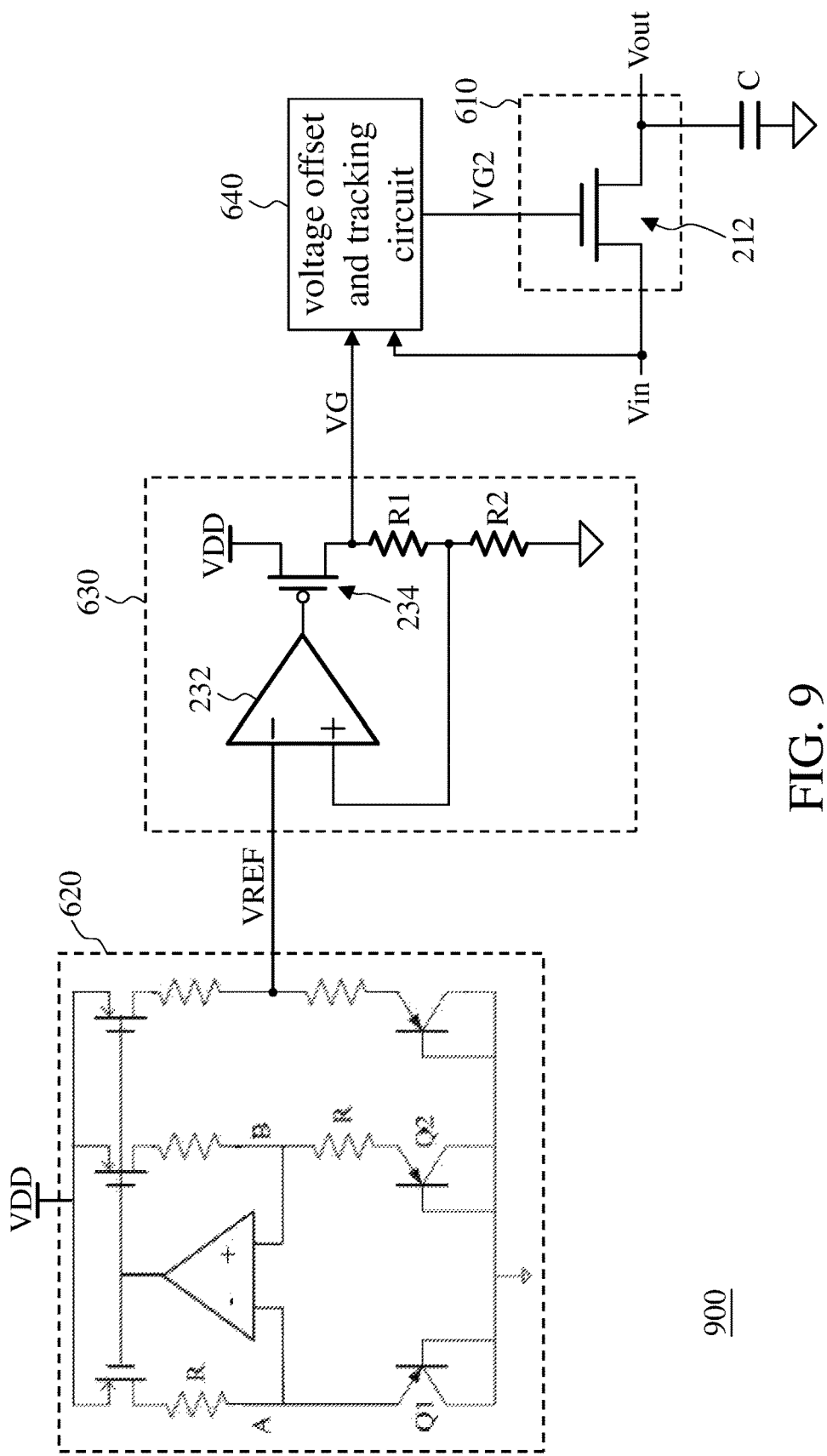
FIG. 9 illustrates a circuit diagram of a filter according to another embodiment of the present invention.

FIG. 9 is a circuit diagram of a filter according to another embodiment of the present invention. This filter is implemented by the active load generation circuit 600 of FIG. 6. The filter 900 is implemented in a chip and includes the impedance element 610, the temperature sensing circuit 620, the voltage control circuit 630, the voltage offset and tracking circuit 640, and the capacitor C. The impedance element 610 is implemented by NMOS 212. For example, assuming that the intermediate voltage VG=2.2V, the common mode voltage VCM=1.8V, the input voltage Vin=1.8V, and $\alpha$=1, the gate-source voltage Vgs of the NMOS 212 is Vgs=VG2−Vin=[1*(2.2−1.8)+1.8]−1.8=0.4V. When Vin becomes 2.8V, Vgs=VG2−Vin=[1*(2.2−1.8)+2.8]−2.8=0.4V; when Vin becomes 0.8V, Vgs=VG2−Vin=[1*(2.2−1.8)+0.8]−0.8=0.4V. Clearly, the control voltage VG2 tracks the input voltage Vin, making the gate-source voltage Vgs of the NMOS 212 substantially constant to ensure that the NMOS 212 maintains a fixed load impedance value.

Figure 10:
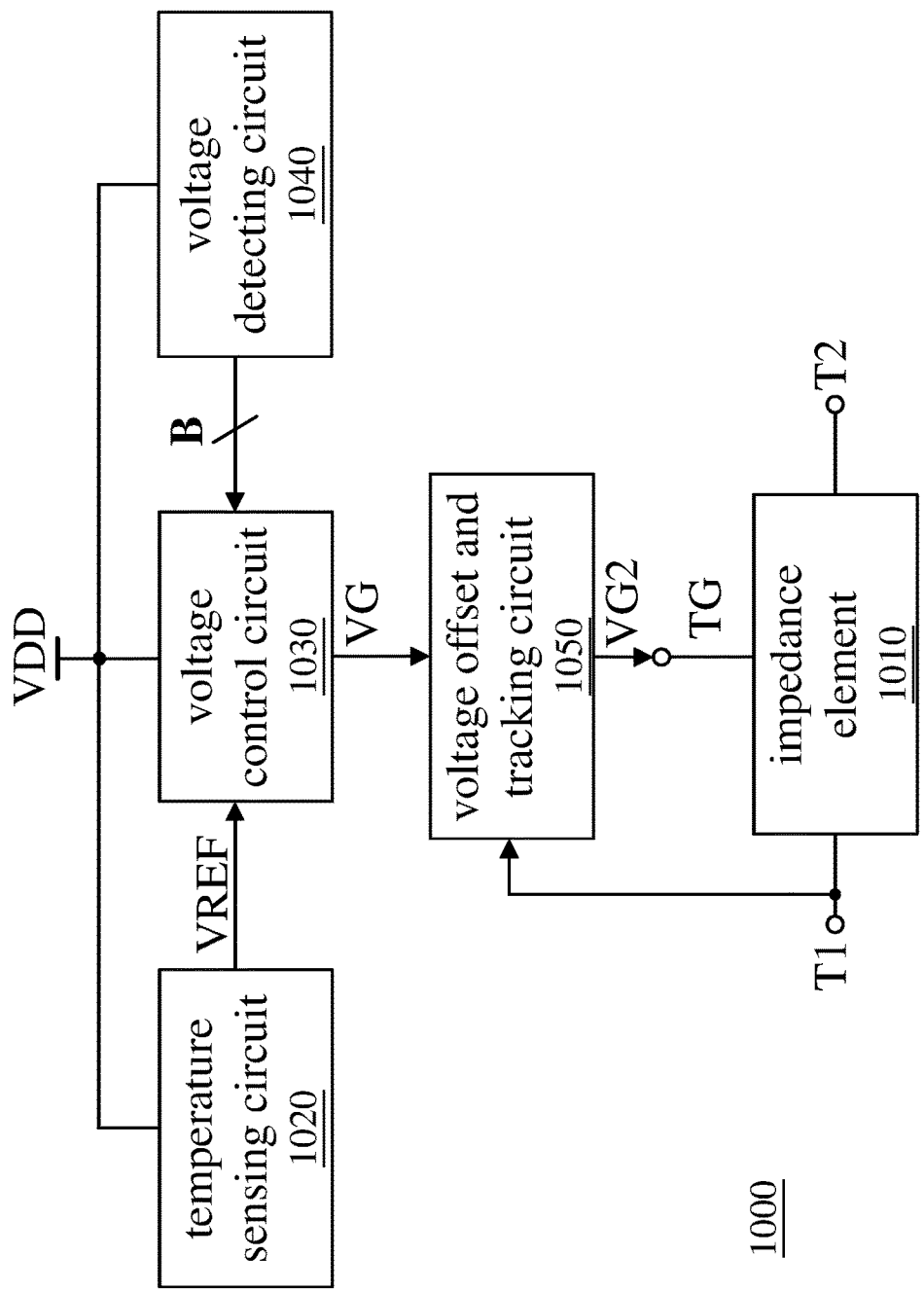
FIG. 10 illustrates a functional block diagram of an active load generation circuit according to another embodiment of the present invention.

FIG. 10 is a functional block diagram of an active load generation circuit according to another embodiment of the present invention. The active load generation circuit 1000 includes the impedance element 1010, the temperature sensing circuit 1020, the voltage control circuit 1030, the voltage detecting circuit 1040, and the voltage offset and tracking circuit 1050. The functions and operations of the impedance element 1010, the temperature sensing circuit 1020, the voltage control circuit 1030, and the voltage detecting circuit 1040 are similar or identical to those of the impedance element 410, the temperature sensing circuit 420, the voltage control circuit 430, and the voltage detecting circuit 440 and are thus omitted for brevity. The impedance element 1010 receives an input signal at the terminal T1, and the voltage control circuit 1030 generates the intermediate voltage VG. The voltage offset and tracking circuit 1050 generates the control voltage VG2 according to the input signal and the intermediate voltage VG, and the control voltage VG2 varies with the input signal. The control terminal TG of the impedance element 1010 receives the control voltage VG2, and the impedance of the impedance element 1010 is related to the control voltage VG2. Examples of the voltage offset and tracking circuit 1050 are shown in FIG. 7 and FIG. 8.

Figure 11:
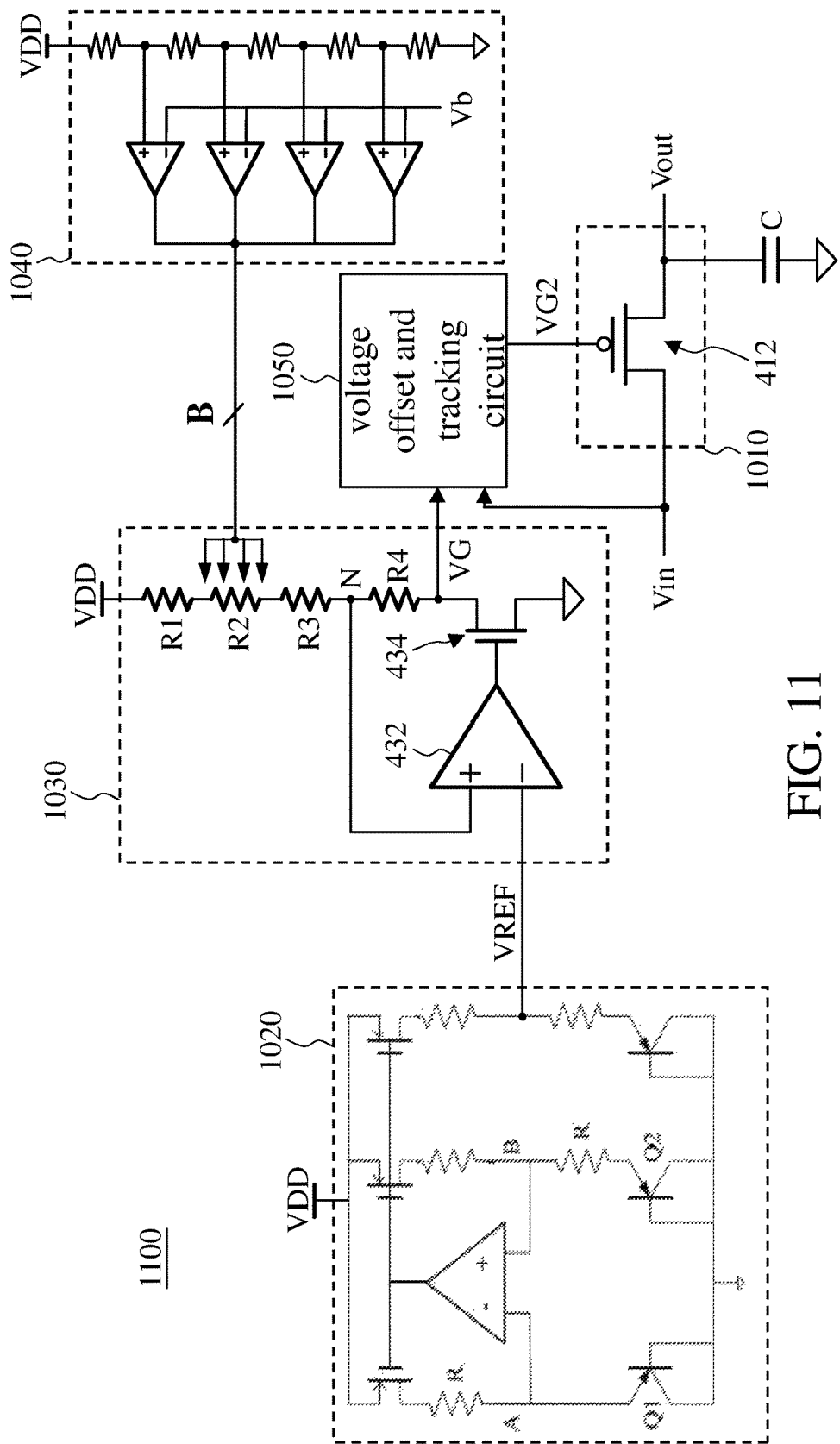
FIG. 11 illustrates a circuit diagram of a filter according to another embodiment of the present invention.

FIG. 11 is a circuit diagram of a filter according to another embodiment of the present invention. This filter is implemented by the active load generation circuit 1000 of FIG. 10. The filter 1100 is implemented in a chip and includes the impedance element 1010, the temperature sensing circuit 1020, the voltage control circuit 1030, the voltage detecting circuit 1040, the voltage offset and tracking circuit 1050, and the capacitor C. The impedance element 1010 is implemented by the PMOS 412. For example, assuming that the intermediate voltage VG=1.4V, the common mode voltage VCM=1.8V, the input voltage Vin=1.8V, and $\alpha$=1, the source-gate voltage Vsg of the PMOS 412 is Vsg=Vin−VG2=1.8−[1*(1.4−1.8)+1.8]=0.4V. When Vin becomes 2.8V, Vsg=Vin−VG2=2.8−[1*(1.4−1.8)+2.8]=0.4V; when Vin becomes 0.8V, Vsg=Vin−VG2=0.8−[1*(1.4−1.8)+0.8]=0.4V. Clearly, the control voltage VG2 tracks the input voltage Vin, making the source-gate voltage Vsg of the PMOS 412 substantially constant to ensure that the PMOS 412 maintains a fixed load impedance value.

The table below shows the area ratio of the active load of the present invention to the passive load for two low pass filters that have different cutoff frequencies. Both filters use an on-chip capacitor with a capacitance value of 20 pF For the filter with fc=80 Hz (the resistance value being 100 MΩ), the area of the active load is only ½₀ of the area of the passive load; for the filter with fc=8 Hz (the resistance value being 1 GΩ), the ratio is only ½₀₀. Clearly, the active load can greatly save the circuit area.

| fc | resistance value and area (A1) of the passive load | resistance value and area (A2) of the active load | capacitance value | area ratio (A2/A1) |
|---|---|---|---|---|
| 80 Hz | 100 MΩ/59231 μm² | 100 MΩ/2975 μm² | 20 pF | 1/20 |
| 8 Hz | 1 GΩ/592185 μm² | 1 GΩ/2975 μm² | 20 pF | 1/200 |

Note that after the voltage detecting circuit 440 (or 1040) is removed from the circuit of FIG. 5 (or FIG. 11), the remaining parts collectively form the circuit of the active load generation circuit 200 (or 600) of FIG. 2 (or FIG. 6) applied to the filter with the impedance element 210 (or 610) implemented by the PMOS. The filters of FIGS. 3, 5, 9, and 11 can be applied to a bandgap voltage reference (BGVR) circuit to filter out the noises in the bandgap voltage. In addition to filters (e.g., low pass filters, high pass filters, band pass filters, etc.), the active load generation circuit of the present invention can also be applied to other circuits. Although the impedance elements in the foregoing embodiment are exemplified by metal-oxide-semiconductor field-effect transistors (MOSFETs), in other embodiments, the impedance elements can be implemented by other transistors (e.g., bipolar junction transistors (BJTs)) or other electronic components. When operating in a saturation region, a BJT can also function as an impedance element. In some embodiments, the foregoing power supply voltage VDD may be positive, zero, or negative, and the foregoing second reference voltage may be positive, zero, or negative.

Since a person having ordinary skill in the art can appreciate the implementation detail and the modification thereto of the present method invention of through the disclosure of the device invention of, repeated and redundant description is thus omitted. Furthermore, the shape, size, and ratio of any element and the step sequence of any flow chart in the disclosed figures are exemplary for understanding, not for limiting the scope of this invention.

The aforementioned descriptions represent merely the preferred embodiments of the present invention, without any intention to limit the scope of the present invention thereto. Various equivalent changes, alterations, or modifications based on the claims of the present invention are all consequently viewed as being embraced by the scope of the present invention.

What is claimed is:

1. An active load generation circuit comprising:
   a transistor that provides an impedance and has a control terminal and an input terminal, wherein the control terminal receives a control voltage, the input terminal receives an input signal, and the impedance is related to the control voltage;
   a voltage control circuit configured to generate an intermediate voltage according to a power supply voltage and a first reference voltage;
   a voltage offset and tracking circuit coupled between the voltage control circuit and the transistor and configured to generate the control voltage according to the input signal and the intermediate voltage, wherein the control voltage varies with the input signal; and
   a temperature sensing circuit coupled to the voltage control circuit and configured to sense an ambient temperature of the active load generation circuit and adjust the first reference voltage according to the ambient temperature.

2. The active load generation circuit of claim 1, wherein the transistor is a first transistor, the control terminal is a first control terminal, and the voltage control circuit comprises:
   a second transistor having a second control terminal and an output terminal, wherein the output terminal of the second transistor outputs the intermediate voltage;
   a plurality of resistors connected in series between the second transistor and the power supply voltage, or between the second transistor and a second reference voltage; and
   an operational amplifier having a first input terminal, a second input terminal, and an output terminal, wherein the first input terminal receives the first reference voltage, the second input terminal is coupled to the resistors, and the output terminal of the operational amplifier is coupled to the second control terminal.

3. The active load generation circuit of claim 2, wherein the first transistor is a P-type metal-oxide-semiconductor field-effect transistor (MOSFET); wherein when the ambient temperature increases, the temperature sensing circuit increases the first reference voltage, and when the ambient temperature decreases, the temperature sensing circuit decreases the first reference voltage.

4. The active load generation circuit of claim 2, wherein the first transistor is an N-type metal-oxide-semiconductor field-effect transistor (MOSFET); wherein when the ambient temperature increases, the temperature sensing circuit decreases the first reference voltage, and when the ambient temperature decreases, the temperature sensing circuit increases the first reference voltage.

5. The active load generation circuit of claim 2, wherein the power supply voltage can be positive, zero, or negative, and the second reference voltage can be positive, zero, or negative.

6. The active load generation circuit of claim 1 further comprising:
   a voltage detecting circuit coupled to the voltage control circuit and configured to detect the power supply voltage to generate a control value;
   wherein the voltage control circuit adjusts the intermediate voltage according to the control value.

7. The active load generation circuit of claim 6, wherein the voltage detecting circuit comprises:
   a plurality of resistors connected in series between the power supply voltage and a second reference voltage and configured to generate a plurality of divided voltages according to the power supply voltage and the second reference voltage; and
   a plurality of comparators coupled to the resistors and configured to generate the control value by comparing the divided voltages with a predetermined voltage.

8. The active load generation circuit of claim 1, wherein the voltage offset and tracking circuit comprises:
   an amplifying circuit configured to amplify a difference between the intermediate voltage and a common mode voltage of the input signal to generate an amplified voltage; and an adding circuit coupled to the amplifying circuit and configured to add the amplified voltage and the input signal to thereby generate the control voltage.

9. An active load generation circuit comprising:

a first transistor that provides an impedance and has a first control terminal, wherein the first control terminal receives a control voltage, and the impedance is related to the control voltage;

a voltage control circuit coupled to the first transistor and configured to generate the control voltage according to a power supply voltage and a first reference voltage, the voltage control circuit comprising:

a second transistor having a second control terminal and a first output terminal, wherein the first output terminal outputs the control voltage;

a plurality of resistors connected in series between the second transistor and the power supply voltage, or between the second transistor and a second reference voltage; and an operational amplifier having a first input terminal, a second input terminal, and a second output terminal, wherein the first input terminal receives the first reference voltage, the second input terminal is coupled to the resistors, and the second output terminal is coupled to the second control terminal; and a temperature sensing circuit coupled to the voltage control circuit and configured to sense an ambient temperature of the active load generation circuit and adjust the first reference voltage according to the ambient temperature.

10. The active load generation circuit of claim 9, wherein the first transistor is a P-type metal-oxide-semiconductor field-effect transistor (MOSFET); wherein when the ambient temperature increases, the temperature sensing circuit increases the first reference voltage, and when the ambient temperature decreases, the temperature sensing circuit decreases the first reference voltage.

11. The active load generation circuit of claim 9, wherein the first transistor is an N-type metal-oxide-semiconductor field-effect transistor (MOSFET); wherein when the ambient temperature increases, the temperature sensing circuit decreases the first reference voltage, and when the ambient temperature decreases, the temperature sensing circuit increases the first reference voltage.

12. The active load generation circuit of claim 9 further comprising:

a voltage detecting circuit coupled to the voltage control circuit and configured to detect the power supply voltage to generate a control value;

wherein the voltage control circuit adjusts the control voltage according to the control value.

13. The active load generation circuit of claim 12, wherein the resistors are first resistors, and the voltage detecting circuit comprises:

a plurality of second resistors connected in series between the power supply voltage and the second reference voltage and configured to generate a plurality of divided voltages according to the power supply voltage and the second reference voltage; and a plurality of comparators coupled to the second resistors and configured to generate the control value by comparing the divided voltages with a predetermined voltage.

14. An active load generation circuit comprising:

a transistor that provides an impedance and has a control terminal, wherein the control terminal receives a control voltage, and the impedance is related to the control voltage;

a voltage control circuit coupled to the transistor and configured to generate the control voltage according to a power supply voltage and a first reference voltage;

a temperature sensing circuit coupled to the voltage control circuit and configured to sense an ambient temperature of the active load generation circuit and adjust the first reference voltage according to the ambient temperature;

a voltage detecting circuit coupled to the voltage control circuit and configured to detect the power supply voltage to generate a control value;

wherein the voltage control circuit adjusts the control voltage according to the control value.

15. The active load generation circuit of claim 14, wherein the voltage detecting circuit comprises:

a plurality of resistors connected in series between the power supply voltage and a second reference voltage and configured to generate a plurality of divided voltages according to the power supply voltage and the second reference voltage; and a plurality of comparators coupled to the resistors and configured to generate the control value by comparing the divided voltages with a predetermined voltage.

16. The active load generation circuit of claim 14, wherein the transistor is a first transistor, the control terminal is a first control terminal, and the voltage control circuit comprises:

a second transistor having a second control terminal and a first output terminal, wherein the first output terminal outputs the control voltage;

a plurality of resistors connected in series between the second transistor and the power supply voltage, or between the second transistor and a second reference voltage; and an operational amplifier having a first input terminal, a second input terminal, and a second output terminal, wherein the first input terminal receives the first reference voltage, the second input terminal is coupled to the resistors, and the second output terminal is coupled to the second control terminal;

wherein the first transistor is a P-type metal-oxide-semiconductor field-effect transistor (MOSFET);

wherein when the ambient temperature increases, the temperature sensing circuit increases the first reference voltage, and when the ambient temperature decreases, the temperature sensing circuit decreases the first reference voltage.

17. The active load generation circuit of claim 14, wherein the transistor is a first transistor, the control terminal is a first control terminal, and the voltage control circuit comprises:

a second transistor having a second control terminal and a first output terminal, wherein the first output terminal outputs the control voltage;

a plurality of resistors connected in series between the second transistor and the power supply voltage, or between the second transistor and a second reference voltage; and an operational amplifier having a first input terminal, a second input terminal, and a second output terminal, wherein the first input terminal receives the first reference voltage, the second input terminal is coupled to the resistors, and the second output terminal is coupled to the second control terminal;

wherein the first transistor is an N-type metal-oxide-semiconductor field-effect transistor (MOSFET);

wherein when the ambient temperature increases, the temperature sensing circuit decreases the first reference voltage, and when the ambient temperature decreases, the temperature sensing circuit increases the first reference voltage.

* * * * *